United States Patent
Tavallaei (10) Patent No.: US 9,311,998 B2
(45) Date of Patent: Apr. 12, 2016

(54) APPARATUS TO STORE DATA AND METHODS TO READ MEMORY CELLS

(75) Inventor: Siamak Tavallaei, Spring, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 158 days.

(21) Appl. No.: 14/342,431

(22) PCT Filed: Sep. 2, 2011

(86) PCT No.: PCT/US2011/050383
§ 371 (c)(1),
(2), (4) Date: Mar. 3, 2014

(87) PCT Pub. No.: WO2013/032488
PCT Pub. Date: Mar. 7, 2013

(65) Prior Publication Data
US 2014/0211544 A1    Jul. 31, 2014

(51) Int. Cl.
*G11C 11/00* (2006.01)
*G11C 13/00* (2006.01)
*G11C 5/04* (2006.01)

(52) U.S. Cl.
CPC ........... *G11C 13/004* (2013.01); *G11C 5/04* (2013.01); *G11C 13/0007* (2013.01); *G11C 13/0033* (2013.01); *G11C 2013/0045* (2013.01); *G11C 2013/0047* (2013.01); *G11C 2013/0073* (2013.01)

(58) Field of Classification Search
CPC ...... H01L 45/08; H01L 45/146; H01L 45/145; H01L 45/1641; G11C 13/0002; G11C 13/00; G11C 11/56; G11C 13/02; G11C 13/025; G11C 2213/33
See application file for complete search history.

(56) References Cited

U.S. PATENT DOCUMENTS

| | | | |
|---|---|---|---|
| 7,382,664 B2 | 6/2008 | Le Phan | |
| 7,453,720 B2 | 11/2008 | Ju et al. | |
| 7,505,347 B2 | 3/2009 | Rinerson et al. | |
| 8,582,344 B2 * | 11/2013 | Strachan | G11C 13/0002 257/4 |
| 2008/0298121 A1 | 12/2008 | Otterstedt et al. | |
| 2009/0003080 A1 | 1/2009 | Noh | |
| 2009/0196093 A1 | 8/2009 | Happ et al. | |
| 2010/0118602 A1 | 5/2010 | Carter et al. | |
| 2010/0290280 A1 | 11/2010 | Seo et al. | |
| 2011/0058405 A1 | 3/2011 | Chen et al. | |

(Continued)

FOREIGN PATENT DOCUMENTS

| | | |
|---|---|---|
| CN | 1373479 | 10/2002 |
| CN | 101055874 | 10/2007 |
| EP | 1622163 A1 | 2/2006 |

OTHER PUBLICATIONS

Chung, A., et al., Topical Review; Nanoscale Memory Device, Sep. 17, 2010, Nanothechnology, vol. 21, No. 41, 22 pages.

(Continued)

*Primary Examiner* — Hien Nguyen
(74) *Attorney, Agent, or Firm* — Hanley Flight & Zimmerman, LLC (57) ABSTRACT

Apparatus to store data and methods to read memory cells are disclosed. A disclosed example method involves, during a read cycle of a memory cell, applying a current across the memory cell to read a content of the memory cell. During a subsequent read cycle of the memory cell, a subsequent current is applied across the memory cell in the opposite direction to read the content of the memory cell.

8 Claims, 6 Drawing Sheets

(56) References Cited

U.S. PATENT DOCUMENTS

| | | |
|---|---|---|
| 2011/0096589 A1 | 4/2011 | Bratkovski et al. |
| 2011/0182104 A1 | 7/2011 | Kim et al. |
| 2011/0228592 A1* | 9/2011 | Kamins ............... G11C 13/0002 365/148 |
| 2011/0248381 A1* | 10/2011 | Tong ................. H01L 21/26586 257/537 |
| 2011/0292713 A1* | 12/2011 | Perner .................... G11C 5/063 365/148 |

OTHER PUBLICATIONS

Supplementary European Search Report, Jan. 20, 2015, European Patent Application No. 11871484.9, 4 pages.

International Search Report and Written Opinion, Korean IPO, Sep. 2, 2012. Hewlett-Packard Development Company, L.P., PCT Application No. PCT/US11/50383.

Kim, et al "A Voltage Scalable 0.26 V, 64 kb 8T SRAM with V-min Lowering Techniques and Deep Sleep Mode", IEEE Journal of Solid-State Circuits, V.44(6), Jun. 2009, pp. 1785-1795.

* cited by examiner

APPARATUS TO STORE DATA AND METHODS TO READ MEMORY CELLS

BACKGROUND

The presence of dopants in an insulating or semiconducting matrix can increase the electrical conductivity of the matrix. Dopants can be introduced into a matrix or moved within a matrix to dynamically alter the electrical operation of an electrical device. In some circumstances, dopant shifting or movement can be induced by applying a current across a matrix. After application of the current, the location and characteristics of the dopants remain stable until the application of another current sufficient to displace the dopants. Typically, changing dopant configurations in a matrix results in changes to the electrical resistance of the device. Electrical devices that exhibit a memory of past electrical conditions through dopant-based changes in electrical resistance are known as memristive devices.

DETAILED DESCRIPTION

A memristive device stores data as a resistance corresponding to a state of a dopant distribution within the memristive device. Because the dopant distribution within the memristive device is reflective of a previously applied current, the memristive device carries a memory of a past electrical current that has been applied to the memristive device.

Accordingly, memristive devices are suitable for use as memory cells. Traditionally, techniques for writing data (e.g., setting a bit to "1" or clearing a bit to "0") to a memristive memory cell involve applying a write current across the memristive memory cell during a write cycle. The traditional reading of a memristive memory cell involved applying a read current in a first direction across the memristive memory cell during a first read cycle, and applying the read current in the same (i.e., the first) direction during subsequent read cycles.

However, in known methods of reading a memristive memory cell, the repeated application of a read current in the same direction across the memristive memory cell may increase dopant in the memristive memory cell. Such dopant increases may require read currents of increasingly greater amperage to enable sensing circuitry to read the data stored in the memristive memory cell, may require higher voltage sources and/or current sources to create the higher read currents, and/or may require longer times to enable sensing circuitry to read the data stored in the memristive memory cell. Repeatedly applying read currents in the same direction across a memristive memory cell eventually increases the dopant level to an overly high concentration or density that may render the memristive memory cell inoperative or unsatisfactory for storing and reading data. That is, the accumulation of dopant redistribution moves an amount of sense current sufficient to read a memristive memory cell away from a nominal center point in either a positive or a negative direction away from the nominal center point. Therefore, the sensitivity of the sensing logic or sensing circuit to read content of a memory cell diminishes over time, eventually rendering the memory cell inoperable or unsatisfactory. In some instances, applying overly high read currents and/or applying read currents for an excessively long time may unintentionally alter or disturb the information stored in the memory cell.

Unlike known methods of reading memory cells, example methods, apparatus, and articles of manufacture disclosed herein can be used to read a memory cell, such as a memristive memory cell, while reducing and, in some examples eliminating, undesirable increases of dopant concentration or distribution in the memory cell. As a result, increased usage life of such a memory cell is achieved.

In some disclosed example methods, during a first read cycle of a memory cell, a first current is applied in a first direction across the memory cell to read a content of the memory cell. During a second read cycle of the same memory cell, a second current is applied across the memory cell in a second direction opposite the first direction to read the content of the memory cell with reduced impact (e.g., without increasing the dopant distribution) on the longevity of the memory cell.

In some disclosed example circuits, the content of a memory cell is read during a first read cycle of the memory cell by applying a first current across the memory cell that changes a first distribution of a dopant of the memory cell to a second distribution. The first and second distributions of the dopant are representative of the same stored information. However, the second dopant distribution has a greater dopant concentration than the first dopant distribution. During a second read cycle of the memory cell, some such example circuits read the content of the memory cell by applying a second current across the memory cell that is to change the second distribution of the dopant to the first distribution of the dopant without changing the information stored in the memory cell.

Figure 1A:
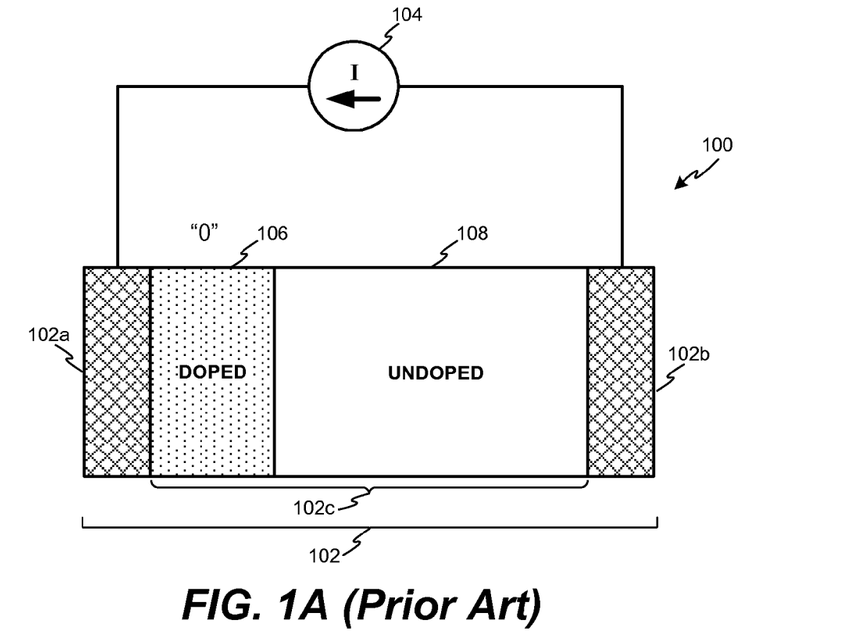
FIGS. 1A and 1B illustrate a prior art memory cell.
Figure 1B:
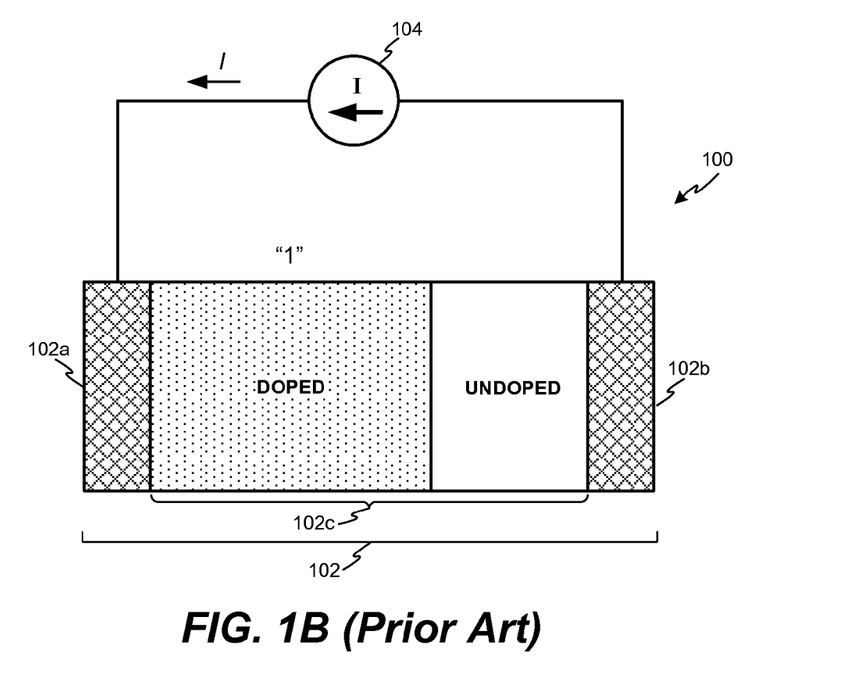

FIGS. 1A and 1B illustrate operations of a known memory 100. A memristive device stores data based on motion of a dopant, such as oxygen ($O_2$), within a matrix material, such as titanium dioxide. Specifically, applying a current of sufficient magnitude to such a memristive device changes dopant levels within the matrix material. The dopant changes alter the electrical resistance of the memristive device. After the application of the current, the change in dopant distribution creates a resistive characteristic representative of stored information (e.g., a "0" or a "1"). The dopant material remains in this state over a long period, thereby retaining a memory of the past current applied to the memristive device. Until another current having sufficient intensity or duration to induce dopant motion is applied to the memristive device, the resistive characteristics of the memristive device remain stable, and thus, the memristive device continues to store the same data.

Accordingly, known memristive devices have been used as memory cells. Traditionally, techniques for writing data (e.g., one or more bits) to a memristive memory cell involve applying a write current across the memristive memory cell during a write cycle. The traditional reading of a memristive memory cell involved applying a read current across the memristive memory cell during a read cycle. In traditional memristive memory cells, the read current would be applied in the same direction during all read cycles.

FIG. 1A shows a traditional memristive memory cell 102. As illustrated in FIG. 1A, the memristive memory cell 102 is in circuit with a current source 104. In particular, the positive end of the current source 104 is in circuit with a first terminal 102a of the memristive memory cell 102, and a negative end of the current source 104 is in circuit with a second terminal 102b of the memristive memory cell 102. In the memristive memory cell 102, a memristive matrix 102c is interposed between the first terminal 102a and the second terminal 102b. The memristive matrix 102c of FIG. 1A has a doped region 106 and an undoped region 108. To use the memristive matrix 102c to store data, its doping is set to a first state. The doping is manipulated or changed from the first state to a second state to store different data. The memristive matrix 102c illustrated in FIG. 1A is in a first state and stores a binary "0." The information stored to the memristive memory cell 102 can be changed by applying a write current of sufficient amperage to the memristive memory cell 102 to cause a sufficient dopant shift to change the resistance of the memristive memory cell 102 and place the memristive memory cell 102 in the second state.

FIG. 1B shows the traditional memristive memory cell 102 of FIG. 1A after a write current has been applied to cause a sufficient dopant shift to place the memristive memory cell 102 in the second state. In FIG. 1B, the write current is sufficient to change the dopant distribution of the memristive matrix 102c such that the data stored in the memristive matrix 102c changes from a binary "0" (a first state as shown in FIG. 1A) into a binary "1" (a second state as shown in FIG. 1B). Once information is stored to the memristive matrix 102c, the information can be read by applying a read current of sufficient amperage to cause a voltage drop or potential difference across the memristive matrix 102c. According to Ohm's law, voltage (V) equals current (I) multiplied by resistance (R) (i.e., V=IR). Accordingly, after a read current is applied to the memristive memory cell 102, measuring the resulting voltage drop across the memristive memory cell 102 identifies the resistance of the cell. Since the dopant distribution of FIG. 1A results in a different resistance from the dopant distribution of FIG. 1B, determining the voltage drop across and/or resistance of the memristive memory cell 102 is sufficient to determine the state of the information stored to the memristive matrix 102c of the memristive memory cell 102. In other words, the measured voltage drop or potential difference across the memristive memory cell 102 is representative of the information stored in the memristive memory cell 102.

Figure 2:
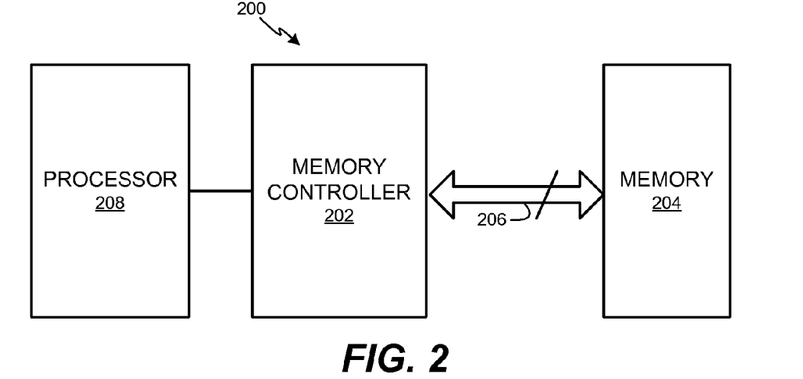
FIG. 2 illustrates an example memory interface configuration.

Turning now to FIG. 2, an example memory interface 200 including a memory controller 202 operatively coupled to a memory 204 is disclosed. The memory controller 202 can be a standalone memory controller integrated circuit (IC) or an embedded memory controller implemented in a processor chip (e.g., fabricated on the same die or located in the same chip package as a processor). In the illustrated example, the memory 204 is a memristive memory. The memristive memory 204 can be a single memristive memory IC or a memory module including multiple memristive memory ICs. In some examples, the memristive memory 204 is an embedded memory implemented in a processor chip (e.g., the processor 208). In the illustrated example, the memory interface 200 includes one or more busses 206. The one or more busses 206 are provided to exchange information, such as data, control signals, and/or the like, between the memory 204 and the memory controller 202.

Figure 3:
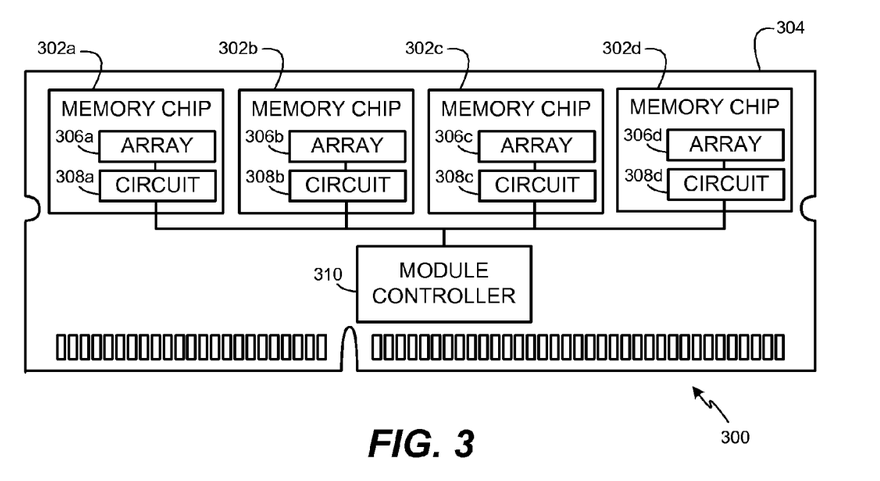
FIG. 3 illustrates an example memory module.

FIGS. 3 and 4 illustrate example memory modules 300 and 400. In the example illustrated in FIG. 3, a PCB in-line memory module 300 is implemented as a multi-chip memory module including four memory chips 302a-d mounted on a PCB 304. Each of the memory chips 302a-d includes an array of memory cells. In particular, the memory chip 302a includes an array of memory cells 306a, the memory chip 302b includes an array of memory cells 306b, the memory chip 302c includes an array of memory cells 306c, and the memory chip 302d includes an array of memory cells 306d. Each of the memory chips 302a-d also includes a respective read/write circuit 308a-d for reading and/or writing data in corresponding ones of the arrays 306a-d. In the illustrated example, the circuits 308a-d are collocated with respective ones of the memory cell arrays 306a-d of the corresponding memory chips 302a-d. For example, the circuit 308a of the memory chip 302a is operatively coupled to the array of memory cells 306a. In the illustrated example, each of the circuits 308a-d can write a logical value to, or read a logical value from, one or more memory cells in a corresponding array 306a-d of the memory chips 302a-d.

The illustrated memory module 300 of FIG. 3 includes a module controller 310 in circuit with the read/write circuits 308a-d of the memory chips 302a-d. In some examples, read and/or write currents applied to the memory chips 302a-d are controlled by the module controller 310, are controlled by the circuits 308a-d, or are controlled by a combination of both. In some examples, the module controller 310 controls the application of currents (e.g., write currents, read currents, or both) to one or more of the memory cell arrays 306a-d. In some examples, the module controller 310 cooperates with one or more of the circuits 308a-d of the memory chips 302a-d to control the application of currents (e.g., write currents, read currents, or both) to the memory cell arrays 306a-d. In some examples, the module controller 310 enables a current to the circuit 308a, and the circuit 308a applies or routes the current to the memory cell array 306a. When applying read currents, the circuit 308a of this example alternates between applying a current in a first direction and applying a current in a second direction opposite the first direction as disclosed herein. In some examples, the module controller 310 sends a current to the circuit 308a, and the circuit 308a amplifies or attenuates the current and delivers the current to the memory cell array 306a.

Figure 4:
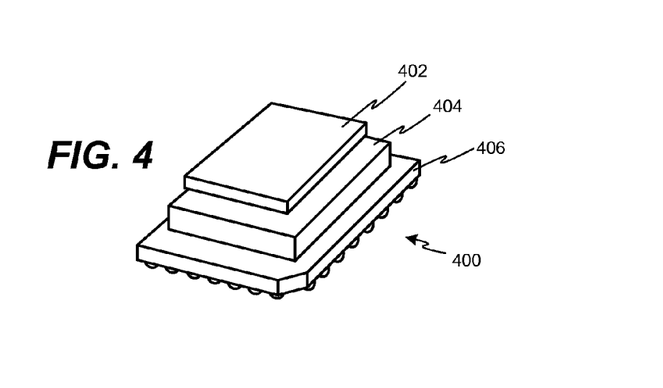
FIG. 4 illustrates another example memory module.

FIG. 4 shows an example chip stack memory module 400. The example chip stack memory module 400 includes a first IC die 402 stacked on a second IC die 404. The IC dies 402 and 404 are carried on a ball grid array (BGA) chip package 406. In the illustrated example, the first IC die 402 can be a memristive memory and the second IC die 404 can be another memristive memory or any other type of memory (e.g., SDRAM, SRAM, or flash memory) or IC (e.g., a processor, a controller, etc.). In some examples, a die is stacked on a processor or controller die, and/or one or more address, control, and/or data lines of the die are routed directly to the processor or controller die internal to the chip stack package. In such examples, memory access external from the chip stack package might not be necessary. Alternatively or additionally, to enable external memory access, address, control, and/or data lines of the memory IC dies can be routed to external chip interfaces (e.g., BGA pads, surface mount pads, chip leads, etc.). Although the chip stack memory module 400 is shown as a BGA package, other types of packages may be used.

FIGS. 5A-5D are example schematic representations of a memristive memory cell 502. FIGS. 5A-5D will be referenced in connection with an example method of reading the memory cell 502, while reducing, eliminating, or preventing undesirable dopant distribution or concentration in the memristive memory cell 502 that could otherwise render the memristive memory cell 502 inoperative or unsatisfactory for storing and reading data. That is, using prior art methods of reading a memristive memory cell, the repeated application of a read current in a same direction across the memristive memory cell may undesirably increase a dopant distribution or concentration in the memristive memory cell. Such increases in dopant distribution or concentration may reach a level such that the resistance of the cell decreases, and thus, under Ohm's law (V=IR), the read currents needed by sensing circuitry to read the data stored to the memristive memory cell become prohibitively high. That is, as dopant concentrations increase in a memristive memory cell, the memory cell resistance decreases. As the resistance of a memory cell decreases, the electrical current needed to generate a sufficient voltage drop or potential difference across the memory cell to read the content of the memory cell increases. Eventually, repeated increases in dopant distribution or concentration in a memristive memory cell may render the memristive memory cell inoperable or unsatisfactory because, for example, the read current amperage to generate a sufficient voltage drop or potential difference becomes too high.

FIGS. 5A-5D illustrate example dopant-level changes as shifting of dopant material between terminals 502a-b for purposes of illustration. However, in some examples, changes in dopant levels, concentrations, or distributions may occur as changes in the density of dopant distributed uniformly or substantially uniformly in the memristive memory cell 502. In such examples, a shift to an increased dopant concentration or distribution results in a relatively denser dopant distribution, whereas a shift to a decreased dopant distribution or concentration results in a relatively sparser dopant distribution.

Figure 5A:
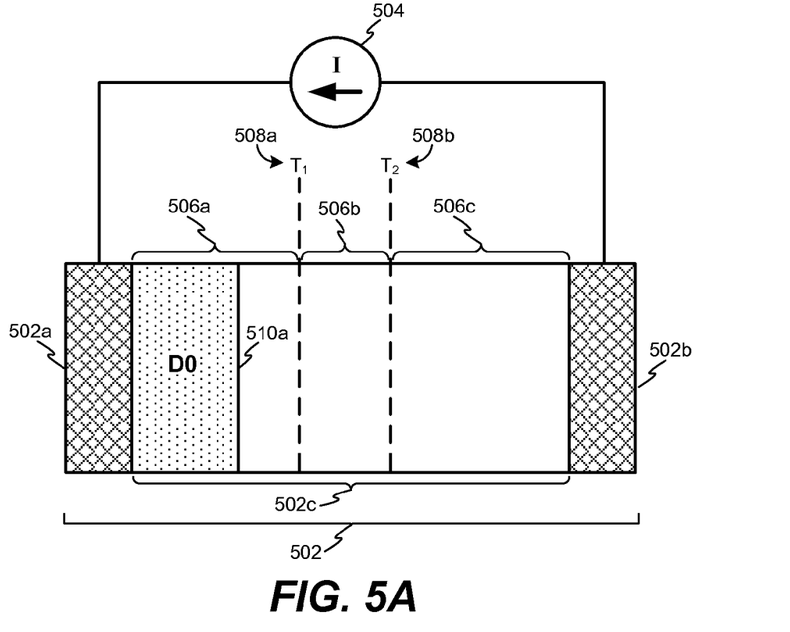
FIG. 5A illustrates an example memory cell operated in accordance with the teachings disclosed herein before an occurrence of a write cycle of the memory cell.

Turning now to FIG. 5A, an example memristive memory cell 502 and an example current source 504 are shown before the occurrence of a write cycle of the memory cell 502. Although the examples of FIGS. 5A-5D show only the memory cell 502 and the current source 504, one or more additional devices may be coupled to the memristive memory cell 502, the current source 504, or both. For example, sensing circuitry (not shown) can be operatively coupled to the memristive memory cell 502 to read data stored in the memristive memory cell 502. As illustrated in FIG. 5A, a positive terminal of the current source 504 is in circuit with a first terminal 502a of the memristive memory cell 502, and a negative terminal of the current source 504 is in circuit with a second terminal 502b of the memristive memory cell 502. Between the first terminal 502a and the second terminal 502b of the memristive memory cell 502 is a memristive matrix 502c. The illustrated memristive matrix 502c is a matrix material such as, for example, titanium dioxide, in which redistributions of dopant (e.g., oxygen ($O_2$)) are effected to store information. As illustrated in FIG. 5A, the memristive matrix 502c has a dopant distribution or concentration indicated as D0 510a.

The memristive matrix 502c illustrated in FIGS. 5A-5D can store information as a binary "1" or a binary "0." However, the memristive matrix 502c need not store binary information and may instead store different types of information. For example, the memristive matrix 502c can store trinary (three level) information. As shown, thresholds T1 508A and T2 508B conceptually separate regions 506a, 506b, and 506c of the memristive matrix 502c. In the illustrated example, the thresholds T1 508A and T2 508B are shown schematically relative to the schematic representations of the shifting dopant levels. In some examples, the thresholds T1 508a and T2 508b are values representing or quantifying the sparseness or denseness of uniformly or substantially uniformly distributed dopant in the memristive matrix 502c.

In the illustrated example, the memristive matrix 502c stores a binary "0" when the dopant distribution or concentration of the memristive matrix 502c is in the region 506a, and stores a binary "1" when the dopant distribution of the memristive matrix 502c is in the region 506c. In some examples, the memristive matrix 502c can be provided with a hysteresis region 506b separating the regions 506a and 506c. In the illustrated example, when the dopant concentration or distribution is in the hysteresis region 506b, the memristive matrix 502c does not deterministically store any information. In the illustrated memristive matrix 502c of FIG. 5A, the dopant distribution D0 510a is in the region 506a, and therefore, in the illustrated example, the memristive matrix 502c stores a binary "0."

Figure 5B:
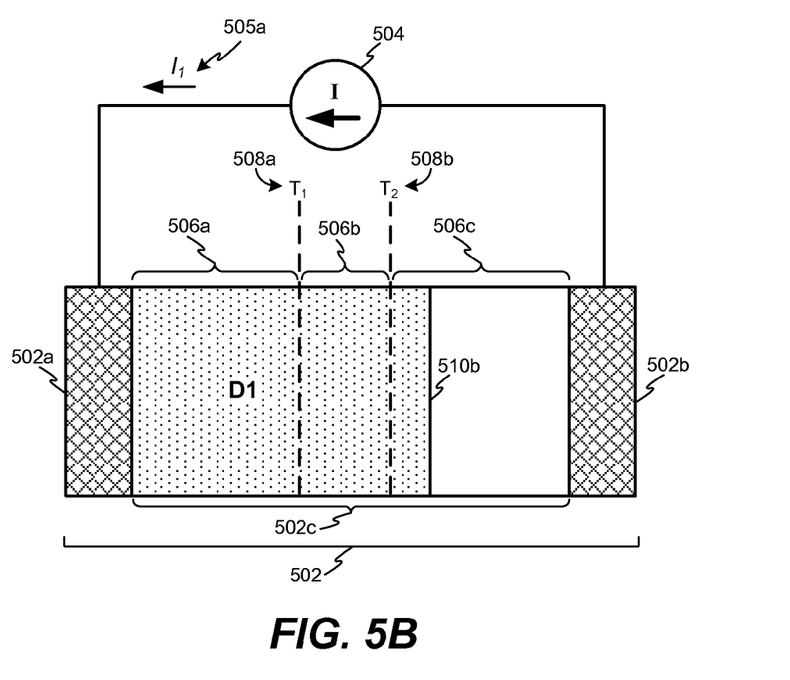
FIG. 5B illustrates the example memory cell of FIG. 5A after the occurrence of the write cycle of the memory cell.

In the illustrated example of FIG. 5B, the memristive memory cell 502 is shown after an occurrence of a write cycle of the memristive memory cell 502. In the illustrated example of FIG. 5B, the write cycle changed the dopant level in the memristive matrix 502c to store a binary "1" in the memristive memory cell 502. As illustrated in FIG. 5B, a write current $I_1$ 505a is applied by the current source 504 in a direction flowing from the first terminal 502a to the second terminal 502b of the memristive memory cell 502. The example write current $I_1$ 505a is a direct current that may be selected based on the fabrication process, die technology, silicon geometry, dopant material, etc. used to fabricate the memristive memory cell 502. As illustrated in FIG. 5B, the example write current $I_1$ 505a causes the dopant in the memristive matrix 502c to shift from dopant distribution D0 510a (as shown in FIG. 5A) to dopant distribution D1 510b. As shown in FIG. 5B, the dopant distribution D1 510b is in the region 506c, and therefore, in the illustrated example, the memristive matrix 502c stores a binary "1," which can be read as a binary "1" during a subsequent read cycle. In the illustrated example of FIG. 5B, the illustrated dopant distribution or concentration D1 510b is relatively close to the threshold T2 508B.

Figure 5C:
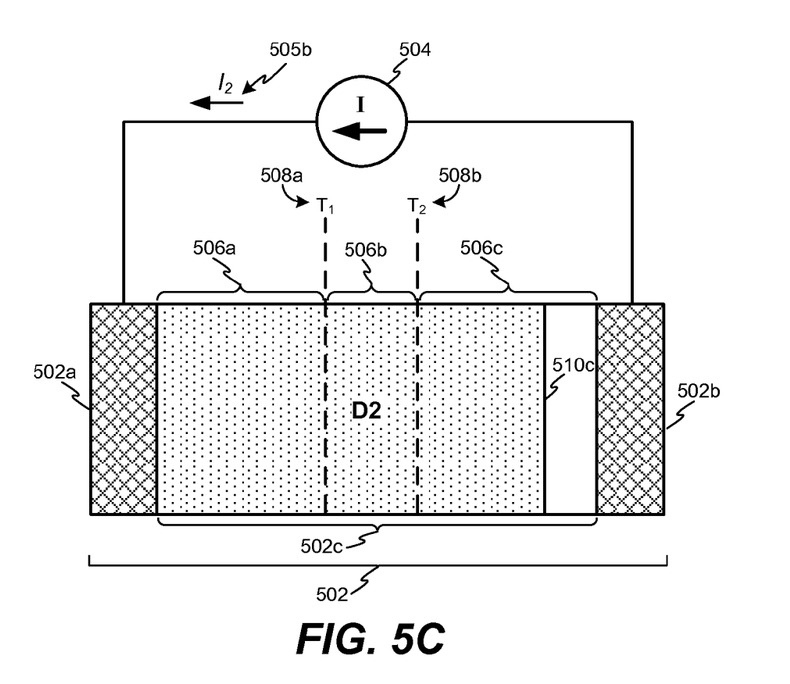
FIG. 5C illustrates the example memory cell of FIG. 5B after an occurrence of a first read cycle of the memory cell.

Turning to FIG. 5C, the memristive memory cell 502 illustrated in FIG. 5B is shown after one or more read cycles, in which an example read current $I_2$ 505b was applied across the memristive memory cell 502. As illustrated in FIG. 5C, the read current $I_2$ 505b was applied by the current source 504 in a direction flowing from the first terminal 502a to the second terminal 502b of the memristive memory cell 502. The example read current $I_2$ 505b is a direct current that may be selected based on the fabrication process, die technology, silicon geometry, dopant material, etc. used to fabricate the memristive memory cell 502. As illustrated in FIG. 5C, and as explained above, the read current causes an undesirable increase or shift in the dopant concentration or distribution in the memristive matrix 502c from dopant distribution or concentration D1 510b (shown in FIG. 5B) to dopant distribution or concentration D2 510C. In the illustrated example, the dopant distribution D2 510C extends further from the threshold T2 508B relative to the dopant distribution D1 510b of FIG. 5B.

Analyzing the dopant states of the memristive matrix 502c as shown in FIGS. 5B-5C reveals that the dopant distribution D1 510b is closer to the threshold T2 508B in FIG. 5B, and the dopant distribution D2 510C is further from the threshold T2 508B in FIG. 5C. As such, the memristive matrix 502c in FIG. 5C is more highly doped than the memristive matrix 502c in FIG. 5B. Generally, as doping of a memristive matrix increases, so too does the amperage of read current that is sufficient to produce a measurable voltage drop across the memristive memory cell, but the information stored therein remains the same. Therefore, for the dopant states of the illustrated memristive memory cell 502 shown in FIGS. 5B and 5C, dopant distributions D1 510*b* and D2 510C will store the same information (e.g., a binary "1"). However, to read the contents of the illustrated memristive matrix 502*c* having the dopant distribution D2 510C as shown in FIG. 5C, the dopant distribution D2 510C requires a read current of sufficiently higher amperage than needed to read the memristive matrix 502*c* when it has the dopant distribution D1 510*b* shown in FIG. 5B.

Traditional methods of reading memristive memory cells apply a read current in the same direction during each read cycle. However, doing so may excessively increase doping of a memristive matrix and require read currents of greater amperage to produce a measurable voltage drop across the memristive memory cell. For example, in the memristive memory cell 502 as illustrated in FIG. 5C, if subsequent read currents similar or identical to $I_2$ 505*b* were applied to the memristive memory cell 502 in the direction of read current $I_2$ 505*b*, then the dopant distribution of the memristive matrix 502*c* would continue to increase, resulting in a need for read currents of greater amperage to read the same stored information.

Figure 5D:
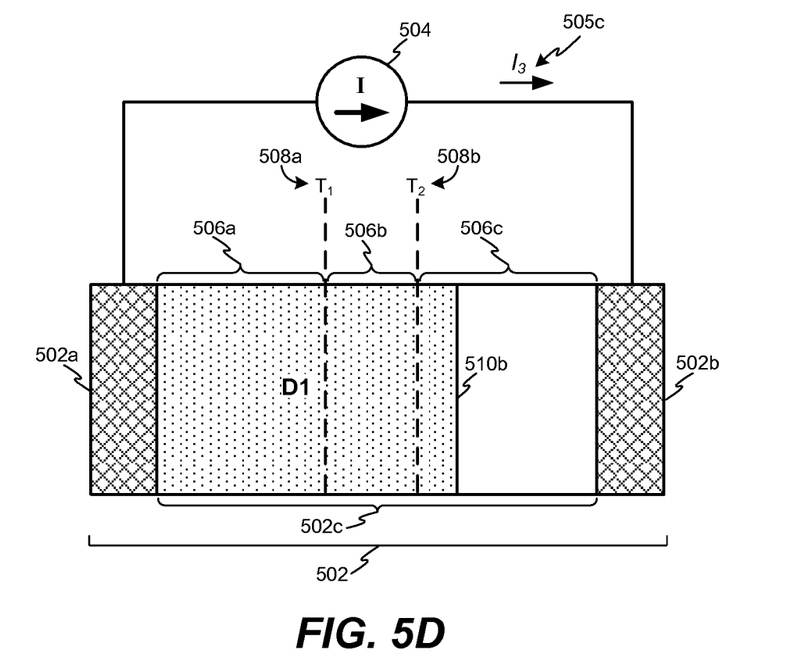
FIG. 5D illustrates the example memory cell of FIG. 5C after an occurrence of a second read cycle of the memory cell.

Turning to FIG. 5D, the memristive memory cell 502 of FIG. 5C is shown after an occurrence of a second read cycle, in which a read current $I_3$ 505*c* was applied across the memristive memory cell 502. Unlike traditional methods, in which read currents are applied in the same direction for each read cycle, the direction of the read current $I_3$ 505*c* illustrated in FIG. 5D is opposite the direction of the read current $I_2$ 505*b* illustrated in FIG. 5C. In particular, the current source 504 is inverted so that the current source 504 delivers a current in a direction flowing from the terminal 502*b* to the terminal 502*a*. In this manner, the read current $I_3$ 505*c* is applied by the current source 504 in a direction opposite the read currents $I_1$ 505*a* and $I_2$ 505*b* of FIGS. 5B and 5C. As illustrated in FIG. 5D, the read current $I_3$ 505*c* causes the dopant in the memristive matrix 502*c* to decrease from the undesirable dopant distribution D2 510C to the relatively more desirable dopant distribution D1 510*b*. Notably, the dopant distribution D1 510*b* is still in region 506*c*, and therefore, the memristive matrix 502*c* stores a binary "1" (i.e., the same information as stored in FIGS. 5B and 5C), which can be read as a binary "1" during a subsequent read cycle. The example read current $I_3$ 505*c* is a direct current that may be selected based on the fabrication process, die technology, silicon geometry, dopant material, etc. used to fabricate the memristive memory cell 502. In the illustrated example, the current value for the example read current $I_3$ 505*c* is selected such that the information or data stored in the memristive memory cell 502 is not unintentionally altered, changed, or deleted when the example read current $I_3$ 505*c* is applied. Advantageously, the memristive matrix 502*c* shown in FIG. 5D still stores a binary "1" while requiring lower amperage read currents and, in turn, less power consumption during subsequent read cycles. Such lower power consumption can be advantageously used to preserve power in battery-powered devices and/or to make any electronic device more energy efficient.

As illustrated in FIGS. 5C and 5D, the read current can be alternated during succeeding read cycles to minimize or eliminate the effect of undesirable increases in dopant distribution or concentration in the illustrated memristive matrix 502*c* of the memristive memory cell 502. For example, with reference to FIG. 5D, if the dopant distribution D1 510*b* became too close to the hysteresis region 506*b*, then a subsequent read current could be applied to the memristive memory cell 502 to increase the dopant distribution D1 510*b* away from the threshold T2 508B. In some examples, a read current can be applied across the illustrated memristive memory cell 502 in a first direction for a predetermined number of read cycles, and the read current can then be applied across the illustrated memristive memory cell 502 in a second direction opposite the first direction for a predetermined number of read cycles. That is, the direction of the read current can be switched at intervals of every $N^{th}$ read cycle, where an interval parameter, N, is greater than or equal to one ("1"). In some examples, the value of the interval parameter, N, may be selected based on performance impact involving a tradeoff between a time penalty for switching the direction of the current versus the benefit of maintaining a balanced dopant distribution in the memristive matrix 502*c*. For example, if switching current directions every, for example, two read cycles (e.g., N=2) incurs too much time and/or resource use, current direction may instead be switched at a larger interval (e.g., N=3 or more). Also, considering the dopant distribution, if switching current directions every, for example, $20^{th}$ read cycle would result in an undesirable dopant distribution (e.g., a distribution that would render the memory cell 502 unreadable or require applying a higher current to the memory cell 502 or applying a current to the memory cell 502 for an undesirably long duration to read the memory cell), current directions can be switched more often (e.g., N=19 or less). In this manner, the value of the interval parameter, N, can be selected by balancing the time/resource penalty incurred for switching the read current direction and the benefit of maintaining a more desirable dopant distribution.

In some examples, the voltage drops or potential differences across the memristive memory cell 502 can be monitored to determine when to alternate the current. For example, when a voltage drop or potential difference becomes too low or too high based on respective voltage threshold values, the read current can be provided in an opposite direction. Additionally or alternatively, the amount of current required to produce a sufficient or acceptable voltage drop or potential difference across the memristive memory cell 502 can be measured. For example, when the read current becomes too high or too low based on respective current thresholds, the read current can be provided in an opposite direction. In this manner, the direction of a read current can be alternated in one or more subsequent read cycles when the read current sufficient to generate a suitable voltage drop or potential difference across a memory cell reaches a predetermined amperage level. For example, a read current can be applied during each read cycle across the illustrated memristive memory cell 502 in a first direction (e.g., the direction of current $I_2$ 505*b* of FIG. 5C) until sensing circuitry (not shown) determines that the read current sufficient to read the contents of the illustrated memristive memory cell 502 is at or above a predetermined level (e.g., due to an undesirably high dopant distribution or concentration during read cycles). Upon that determination, the read current can be applied across the illustrated memristive memory cell 502 in an opposite direction (e.g., the direction of current $I_3$ 505*c* of FIG. 5D).

Figure 6A:
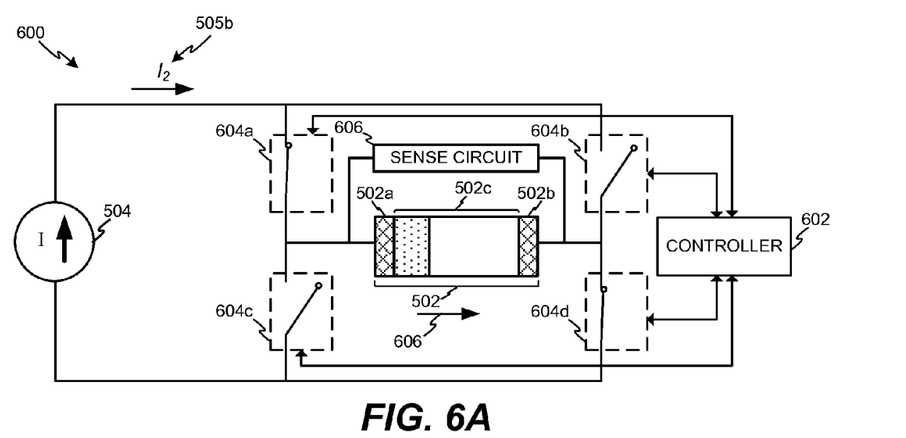
FIGS. 6A-6B illustrate an example circuit that can be used to provide currents across the example memory cell shown in FIGS. 5A-5D.
Figure 6B:
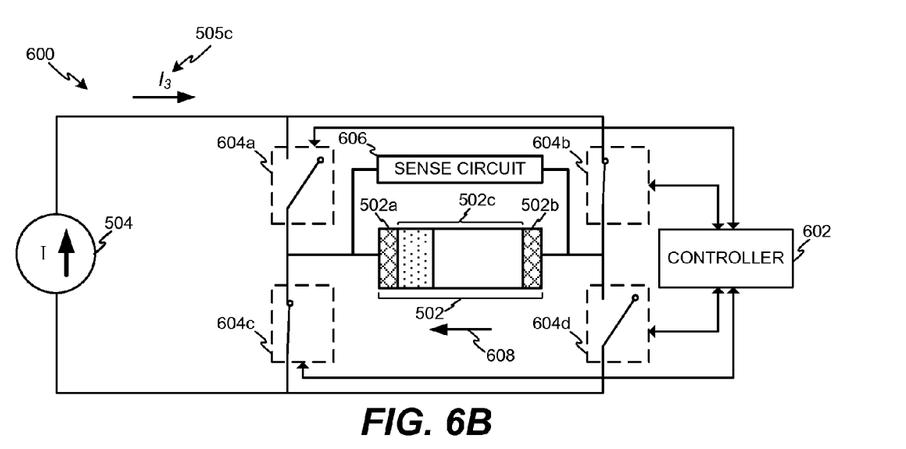

FIGS. 6A-6B illustrate a circuit 600 that can be used to alternate a current across the memristive memory cell 502 of FIGS. 5A-5D. The illustrated circuit 600 can be used to implement the techniques disclosed above in connection with FIGS. 5A-5D to reduce, eliminate, or prevent undesirably high dopant levels in the memristive memory cell 502. The circuit 600 illustrated in FIGS. 6A-6B is an H-bridge circuit, in which the current source 504 is in circuit with the memristive memory cell 502. Although an H-bridge circuit is shown in the illustrated example of FIGS. 6A-6B, in other examples, any other suitable circuit may be used including, for example, an op-amp circuit. In the example of FIGS. 6A-6B, the current source 504 and the memristive memory cell 502 are in circuit with four switches 604a-d such as, for example, PNP bipolar junction transistors (BJT), P-channel metal-oxide-semiconductor field-effect transistors (MOSFET), and/or the like. Each of the switches 604a-d is operably coupled to a current controller 602. The current controller 602 may be implemented by any of the controllers and/or circuits disclosed above such as, for example, the memory controller 202 (FIG. 2), the module controller 310 (FIG. 3), and/or one or more of the circuits 308a-d (FIG. 3). In the illustrated example, the current controller 602 selectively applies signals to the switches 604a-d to selectively close (e.g., place in a state to pass current) or open (e.g., place in a state to not pass current) the switches 604a-d. FIG. 6A shows the circuit 600 in a first configuration in which a current is applied in a first direction across the memristive memory cell 502. FIG. 6B shows the circuit 600 in a second configuration in which the current is applied in a second direction opposite the first direction across the memristive memory cell 502.

In the illustrated example, the circuit 600 also includes a sense circuit 606 to read content of the memristive memory cell 502 by sensing voltage drops or potential differences across the memristive memory cell 502 that are created based on the current applied across the memristive memory cell 502 and the resistance characteristic of the memristive memory cell 502 attributable to the dopant level thereof. In this manner, when the current controller 602 causes the current source 504 to apply currents across the memristive memory cell 502, reads of the content of the memristive memory cell 502 can be made by using the sense circuit 606 to sense voltage drops or potential differences across the memristive memory cell 502. In the illustrated example, the sense circuit 606 is implemented using electrical circuit devices formed adjacent or proximate to the memristive memory cell 502 during integrated-circuit fabrication processes. In other examples, other circuits or devices may be used to implement the sense circuit 606.

As shown in FIG. 6A, switches 604a and 604d are closed, and switches 604b and 604c are open. Accordingly, when the current source 504 applies a current $I_2$ 505b to the memristive memory cell 502, the current $I_2$ 505b will flow across the switch 604a, across the memristive memory cell 502 in a first direction (indicated by reference numeral 606), and across the switch 604d. In the illustrated example of FIG. 6A, the current $I_2$ 505b flows across the memristive memory cell 502 in the first direction 606 by flowing from the first terminal 502a of the memristive memory cell 502 to the second terminal 502b of the memristive memory cell 502.

As shown in FIG. 6B, the switches 604b and 604c are closed, and switches 604a and 604d are open. Accordingly, when the current controller 602 causes the current source 504 to apply a current $I_3$ 505c to the memristive memory cell 502, the current $I_3$ 505c will flow across the switch 604b, across the memristive memory cell 502 in a second direction (indicated by reference numeral 608) opposite the first direction 606 (FIG. 6A), and across the switch 604c. In the illustrated example of FIG. 6B, the current $I_3$ 505c flows across the memristive memory cell 502 in the second direction 608 by flowing from the second terminal 502b of the memristive memory cell 502 to the first terminal 502a of the memristive memory cell 502.

The current controller 602 of FIGS. 6A-6B may be implemented using any desired combination of hardware, firmware, and/or software. For example, one or more integrated circuits, discrete semiconductor components, and/or passive electronic components may be used. Thus, for example, the current controller 602, or parts thereof, could be implemented using one or more circuit(s), programmable processor(s), application specific integrated circuit(s) (ASIC(s)), programmable logic device(s) (PLD(s)), field programmable logic device(s) (FPLD(s)), etc. In some examples, the current controller 602, or parts thereof, may be implemented using instructions, code, and/or other software and/or firmware, etc. stored on a machine accessible medium or computer readable medium (e.g., a random access memory (RAM), a read only memory (ROM), a flash memory, a memristive memory, an optical memory, etc.) and executable by, for example, a processor (e.g., the example processor 208 of FIG. 2) or a controller (e.g., the example memory controller 202 of FIG. 2 and/or the example module controller 310 of FIG. 3). When any of the appended claims are read to cover a purely software implementation, at least the current controller 602 is hereby expressly defined to include a circuit or a tangible medium such as a solid state memory, a magnetic memory, a digital versatile disk (DVD), a compact disk (CD), etc.

Figure 7:
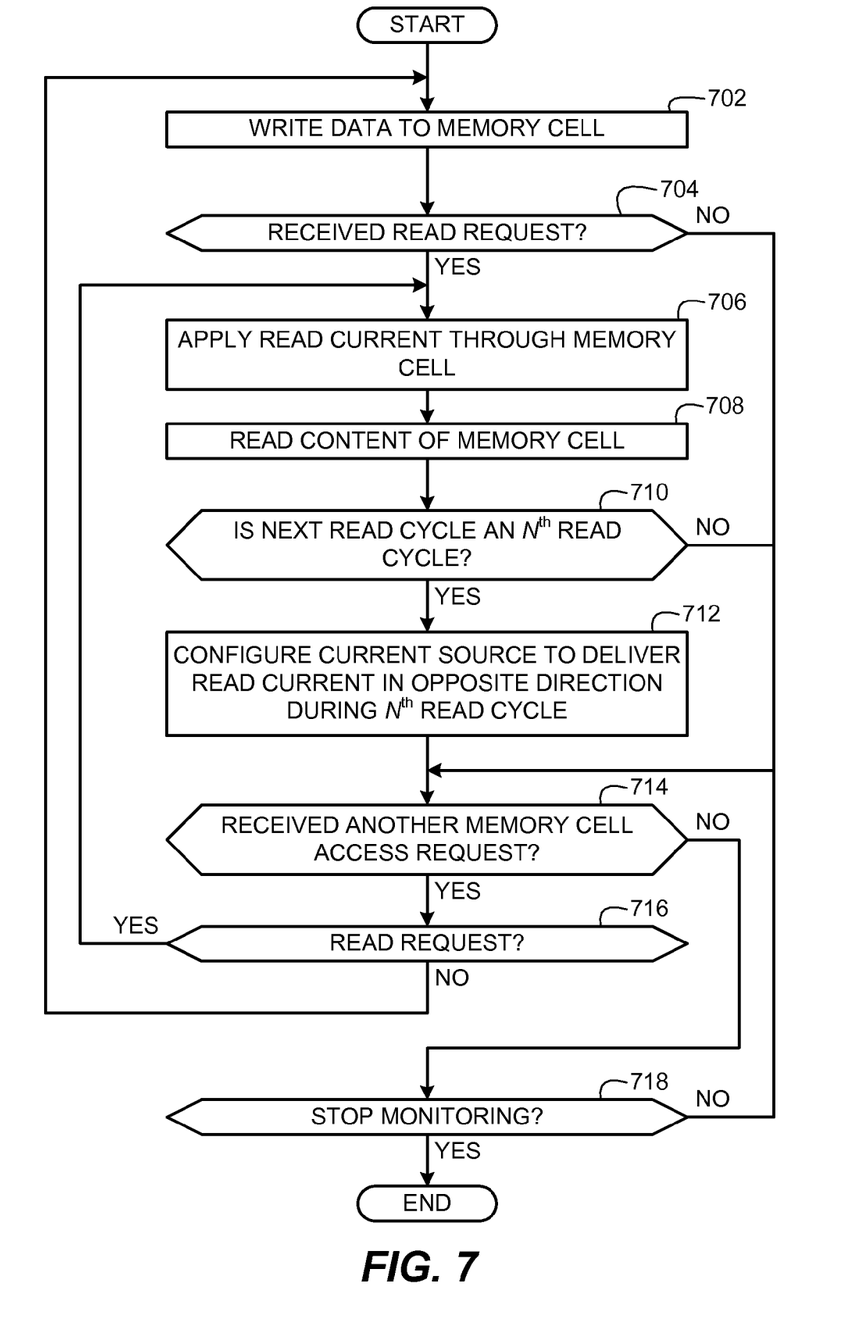
FIG. 7 is a flow diagram illustrating an example process that can be used to read memory content.

Turning to FIG. 7, a flow diagram illustrates an example process that can be used to read content stored to a memory cell (e.g., the memristive memory cell 502 of FIGS. 5A-5D, 6A, and 6B) as disclosed above in connection with FIGS. 5A-5D, 6A, and 6B. For clarity, the example process of FIG. 7 is disclosed below as performed by the current controller 602 of FIGS. 6A-6B. However, the same process or similar processes may be implemented by one or more of the module controller 310 (shown in FIG. 3), the memory controller 202 (shown in FIG. 2), any of the example circuits 308a-d of the memory chips 302a-d (shown in FIG. 3), the example first IC die 402 or second IC die 404 (shown in FIG. 4), alone or in combination, or by any other suitable apparatus. In some examples, one or more of the circuits 308a-d, the memory controller 202, and/or the module controller 310, alone or in combination, may implement the current controller 602 of FIG. 6 to perform the example process of FIG. 7.

The example process of FIG. 7 may be performed using one or more processors, controllers, and/or any other suitable processing devices. For example, the example process of FIG. 7 may be implemented using coded instructions (e.g., computer readable instructions) stored on one or more tangible computer readable media such as flash memory, read-only memory (ROM), and/or random-access memory (RAM). As used herein, the term tangible computer readable medium is expressly defined to include any type of computer readable storage and to exclude propagating signals. Additionally or alternatively, the example process of FIG. 7 may be implemented using coded instructions (e.g., computer readable instructions) stored on one or more non-transitory computer readable media such as flash memory, read-only memory (ROM), random-access memory (RAM), cache, or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

Alternatively, some or all of the example process of FIG. 7 may be implemented using any combination(s) of application specific integrated circuit(s) (ASIC(s)), programmable logic device(s) (PLD(s)), field programmable logic device(s) (FPLD(s)), discrete logic, hardware, firmware, etc. Also, some or all of the example process of FIG. 7 may be implemented manually or as any combination(s) of any of the foregoing techniques, for example, any combination of firmware, software, discrete logic and/or hardware. Further, although the example process of FIG. 7 are described with reference to the flow diagram of FIG. 7, other methods of implementing the process of FIG. 7 may be employed. For example, the order of execution of the blocks may be changed, and/or some of the blocks described may be changed, eliminated, sub-divided, or combined. Additionally, any or all of the example process of FIG. 7 may be performed sequentially and/or in parallel by, for example, separate processing threads, processors, devices, discrete logic, circuits, etc.

In the illustrated example of FIG. 7, the example process may perform one or more write operations to the memristive memory cell 502 during one or more write cycles. In addition, the example process of FIG. 7 may perform one or more read operations on the memristive memory cell 502 during one or more read cycles. In the illustrated example, the write cycles and read cycles may be separated from one another by one or more other intervening read and/or write cycles. For example, one or more read and/or write cycles may occur between a write cycle and a subsequent read and/or write cycle and/or one or more read and/or write cycles may occur between a read cycle and a subsequent read and/or write cycle.

Initially, the current controller 602 applies a write current across a memory cell (e.g., the memristive memory cell 502 of FIGS. 5A-5D, 6A, and 6B) to store data in the memory cell (block 702). As explained above, the application of the write current across the memory cell 502 changes a distribution or concentration of dopant in the memory cell 502 to a particular distribution or concentration (e.g., the dopant distribution D1 510$b$ of FIG. 5B) corresponding to the written information. In this manner, the dopant distribution can be used to represent stored data that can be later read during a read cycle of the memory cell 502.

The current controller 602 then determines if a read request has been received (block 704). If a read request has not been received, control advances to block 714. If a read request has been received (block 704), the current controller 602 applies a read current (e.g., the read current I$_2$ 505$b$ of FIGS. 5C and 6A) across the memory cell 502 during a read cycle (block 706). In the illustrated example, during the same read cycle, the sense circuit 606 performs a reading of a content of the memory cell 502 (block 708). As explained above, the application of the read current I$_2$ 505$b$ can cause the dopant distribution or concentration in the memory cell 502 to change from the first distribution D1 510$b$ of FIG. 5B to a second undesirable distribution D2 510C of FIG. 5C.

The current controller 602 then determines if a next read cycle is an N$^{th}$ read cycle (block 710). In the illustrated example, the interval parameter, N, is greater than or equal to one ("1") as discussed above in connection with FIGS. 5C and 5D. In some examples, the value of the interval parameter, N, may be selected based on performance impact involving a tradeoff between a time penalty for switching the direction of the current versus the benefit of maintaining a balanced dopant distribution in the memristive matrix 502$c$.

If the current controller 602 determines at block 710 that the next read cycle is not an N$^{th}$ read cycle, control advances to block 714. Otherwise, if the next read cycle is an N$^{th}$ read cycle, the current controller 602 sets or configures the current source 504 to deliver a subsequent read current during the N$^{th}$ read cycle in an opposite direction relative to a previous read current (block 712). For example, if a read current previously applied at block 706 is the read current I$_2$ 505$b$ (FIG. 5C) flowing in a direction from the first terminal 502$a$ to the second terminal 502$b$ of the memristive memory cell 502, at block 712 the current controller 602 sets or configures the current source 504 to deliver the read current I$_3$ 505$c$ (FIG. 5D) during the N$^{th}$ read cycle in a direction flowing from the second terminal 502$b$ to the first terminal 502$a$. In the illustrated example, the process of FIG. 7 sets or configures the polarity or direction of the current source 504 prior to receiving a subsequent (e.g., N$^{th}$) read request so that the current source 504 is pre-configured when the subsequent read request is received. In this manner, when the subsequent (e.g., N$^{th}$) read request is received, a delay or time penalty is not incurred for configuring the current source 504 between receipt of the read request and performance of the read access operation. Instead, because the current controller 602 has already set or configured the current source 504 after the previous read cycle, the current source 504 can deliver the read current in the opposite direction during the subsequent (e.g., N$^{th}$) read cycle with relatively less or no delay after receiving a subsequent read request than if the current controller 602 needed to configure the current source 504 between receipt of the subsequent read request and performance of the subsequent read cycle.

The current controller 602 determines whether another memory cell access request has been received (block 714). If another memory cell access request has been received, the current controller 602 determines whether it is a read request (block 716). If the memory cell access request is not a read request, control returns to block 702 to perform a write operation. However, if the memory cell access request is a read request, control returns to block 706, at which the current source 504 applies a subsequent read current through the memory cell 502. For example, if the read request corresponds to an N$^{th}$ (e.g., subsequent) read cycle, the current source 504 applies the read current I$_3$ 505$c$ (FIG. 5D) in a direction opposite the read current applied by the current source 504 during a previous read cycle (e.g., the read current I$_2$ 505$b$ of FIG. 5C previously applied at block 706). In the illustrated example, during the same subsequent (e.g., N$^{th}$) read cycle, the sense circuit 606 performs a subsequent reading of the content of the memory cell 502 at block 708. As explained above, application of the read current I$_3$ 505$c$ during a subsequent (e.g., N$^{th}$) read cycle is to cause the dopant distribution or concentration in the memory cell 502 to change from the second undesirable distribution D2 510C of FIG. 5C to the first distribution D1 510$b$ of FIG. 5D.

As discussed above, in some examples, the memory cell 502 is read one or more times between reversing the direction of the current between the direction of the read current I$_2$ 505$b$ and the direction of the read current I$_3$ 505$c$. That is, the techniques disclosed herein may be used by alternating or switching read current directions during each consecutive read cycle or at spaced intervals in which the read current is applied in a first direction for a particular quantity of consecutive read cycles, switched at an N$^{th}$ ready cycle, and applied in a second direction opposite the first direction for a subsequent quantity of consecutive read cycles until a next N$^{th}$ ready cycle is reached.

Returning to block 714, if another memory cell access request is not received (e.g., for a duration since a previous memory cell access request), the current controller 602 determines whether to stop monitoring for memory cell access requests (block 718). For example, if the memory cell 502 or a memory device in which the memory cell 502 is located is turned off or placed in a standby mode, sleep mode, or other low power mode, the current controller 602 may determine that it should stop monitoring for memory cell access requests. If the current controller 602 should continue to monitor for memory cell access requests, control returns to block 714. Otherwise, the example process of FIG. 7 ends.

Although certain methods, apparatus, and articles of manufacture have been disclosed herein, the scope of coverage of this patent is not limited thereto. To the contrary, this patent covers all methods, apparatus, and articles of manufacture fairly falling within the scope of the claims either literally or under the doctrine of equivalents.

What is claimed is:

1. A method to read a memory cell, comprising:

during a read cycle of the memory cell, applying a current across the memory cell to read a content of the memory cell; and during a subsequent read cycle of the memory cell, applying a subsequent current across the memory cell in a direction opposite the current to read the content of the memory cell.

2. The method of claim 1, wherein:

applying the current changes a first distribution of a dopant in the memory cell to a second distribution of the dopant, the first and second distributions of the dopant representing a same stored information; and applying the subsequent current is to render the first distribution of the dopant.

3. The method of claim 2, wherein the first and second distributions of the dopant are to be above a threshold to represent the same stored information.

4. The method of claim 2, further comprising, during a write cycle occurring before the read cycle, applying a third current across the memory cell to render the first distribution of the dopant in the memory cell.

5. The method of claim 1, wherein the memory cell is a memristive memory cell.

6. The method of claim 1, wherein the current and the subsequent current are direct currents.

7. The method of claim 1, further comprising performing at least one intervening read cycle of the memory cell between the read cycle and the subsequent read cycle.

8. The method of claim 1, further comprising, prior to receiving a request for the subsequent read cycle, changing an electrical current configuration to apply the subsequent current across the memory cell in the direction opposite the current.

* * * * *